Oct. 30, 1962 D. T. KELLEY 3,060,553

METHOD FOR MAKING SEMICONDUCTOR DEVICE

Original Filed Sept. 25, 1956 2 Sheets-Sheet 1

Inventor:-
Dale T. Kelley,
By Mueller & Aichele
Atty's.

Oct. 30, 1962 D. T. KELLEY 3,060,553

METHOD FOR MAKING SEMICONDUCTOR DEVICE

Original Filed Sept. 25, 1956 2 Sheets-Sheet 2

Inventor:-
Dale T. Kelley,
By Mueller & Aichele Atty's.

United States Patent Office 3,060,553

Patented Oct. 30, 1962

3,060,553

METHOD FOR MAKING SEMICONDUCTOR DEVICE

Dale T. Kelley, Phoenix, Ariz., assignor to Motorola, Inc., Chicago, Ill., a corporation of Illinois Continuation of abandoned application Ser. No. 847,718, Oct. 21, 1959, which is a division of application Ser. No. 611,840, Sept. 25, 1956. This application June 12, 1962, Ser. No. 202,649
4 Claims. (Cl. 29—25.3)

This application is a continuation of my copending application Serial No. 847,718, filed October 21, 1959, now abandoned, which was a divisional application from my application Serial No. 611,840, filed September 25, 1956, and now abandoned, and is directed to the method of manufacturing semiconductor devices. Such invention is described herein as embodied in the method for making a power transistor, but it is not limited alone to such embodiment, and is equally applicable to the fabrication of other types of semiconductor devices wherein the necessary jigging is accomplished in the different pieces or parts themselves without the use of independent jigs. High-speed assembly on a mass-production basis is attained, and the self-jigging is such that a very high degree of reproducibility is possible and very high yields have been obtained from such production. In other words, the method of manufacture of the present invention makes possible mass production with its high-output, low-cost advantages for a product which type requires essentially a miniature, watch making type of manufacturing, and such method of manufacture produces devices which are each essentially the same in structure and characteristics so that the method thus provides a high degree of reproducibility in the products manufactured.

A power transistor can be considered generally as a semiconductor device for controlling or amplifying power from either an A.C. or a D.C. source. However, that which distinguishes a power transistor from other semiconductor devices is its high heat dissipation characteristic. By the same token, a power transistor is commercially acceptable in the average electronic circuit application in proportion to its ability to dissipate the generated heat therein, as well as to maintain long life and acceptable operating characteristics in normal as well as severe ambient temperature conditions. In fact, power transistors are generally rated on the basis of maximum junction temperature and on the temperature difference per watt between the junction and the mounting base of the device. At the same time, a power transistor in order to be competitive in the electronic field must be rugged mechanically as well as electrically, and must be low in cost.

Although there has been a need for a power unit since the advent of the transistor and a great deal of research and engineering has gone into semiconductor devices generally, and into power transistors specifically, the art had not reached acceptable levels in the above noted respects for most applications until the advent of the present invention. Excessive internal heating upon operation of a power transistor reduces its power handling ability by producing distortion of the signals translated by the device, and it can destroy the semiconductor subassembly within the device. This internal heating is principally developed at the collector junction of the transistor. Prior constructions for dissipating the heat have included a bot or the like extending from the collector junction and through the housing to the outside of the transistor, and another power transistor construction has an enclosure with cooling fluid therein in contact with such junction, but these expedients caused complications in assembly, increased the cost, and did not satisfactorily remove the generated heat.

The susceptibility of semiconductor devices including power transistors to heat damage, to chemical contamination, and to damage by dirty processing has made manufacturing prior to the present invention both difficult and expensive. Heat necessary for soldering with flux was objectionable. Similarly, welding, particularly in encapsulating the unit, caused heat damage, and has not been a satisfactorily means for securing parts together.

It is an object of the present invention to provide a semiconductor device which will perform satisfactorily as to its electrical requirements for power control or amplification at ambient temperatures under 90° C.

A further object is to provide a semiconductor device which will have a high heat-dissipation characteristic which is at least one watt per 1° C., differential between the collector electrode and the mounting for the device so that internal heat generation during operation will not be harmful to the device itself or to its operation. In that connection, it is an object to provide a collector electrode structure and assembly which will insure high heat-dissipation capabilities for the device.

It is also an object to provide a structure which will accomplish the preceding objects in a simple, rugged, and low-cost device.

A still further object of my invention is to provide a method for manufacturing a semiconductor device coming within the objects as above noted, and a method which will avoid mechanical or chemical injury to the internal semiconductor assembly during complete manufacture so as to provide maximum life in the device, and yet provide a method which will keep the final cost of the device at a competitive level.

One of the features of the present invention is the provision of a semiconductor device of which a power transistor is a specific embodiment, wherein a preassembled semiconductor portion thereof is mounted directly upon a base which serves as a sturdy and readily assembled frame and when it is a part of the final device acts successfully to dissipate heat during the operation of the device. As a result the device will perform satisfactorily and with a long life in ambient temperatures up to 90° C., and has performed at temperatures in excess thereof.

Another feature of my invention is the provision of a one-piece stamped metal base of substantial thickness with high heat dissipation capability and of a configuration for easy mounting in electronic equipment, which base has an integral pedestal or raised portion therein to serve directly as a mechanical mounting for a preassembled semiconductor unit and at the same time to serve with the remainder of the one-piece base as one of the electrodes of the semiconductor device. In this assembly the pedestal portion becomes the collector junction mounting, and the heat generated at the junction is conducted with maximum efficiency therefrom.

The stamped metal base for the device of my invention represents additional features in that its diamond-shaped configuration may be stamped out with a minimum of metal scrap or wastage without impairing the thermal properties of the base. In addition this configuration and the integral raised pedestal therein have the double function first, of permitting a broad effective thermal contact with a heat radiator to which it is mounted in the electronic apparatus, and secondly, of providing heat conduction from the semi-conductor unit on the pedestal and through the remainder of the base to the radiator which is so rapid that there is less than 1° C. difference in temperature between the semiconductor junction at the pedestal and the heat radiator per watt of power dissipated.

A further feature of the invention is the provision of a semiconductor unit made up as a preassembly and a one-piece metal clip which serves as a frame for the unit when the latter and the clip go together very readily as a subassembly. Then this subassembly serves a self-jigging function and facilitates production in the assembly of the complete semiconductor device. This is important in the transistor art wherein elements are small and sometimes fragile such as to normally complicate the handling thereof during manufacture.

An important feature of my invention is the provision of a structure with components, subassemblies, and a final structure which all together make possible the successful utilization of my method of manufacturing a power transistor on a mass-production basis, in a continuous operation, and with relatively unskilled personnel.

Another feature in the method of my invention is the provision of silver plating and gold plating for the metal elements of the device, employing preformed solder rings at points for solder junctures, and then accomplishing the soldering in an inert or reducing atmosphere in a heated furnace so that the assembly of such elements is complete without the use of flux. Eliminating flux eliminates the dangers therefrom of injury to the transistor, and makes for an inexpensive reliable transistor.

A still further feature of my invention is the provision of a cold sealing method for applying a housing to the semiconductor assembly which provides an airtight long-time seal or closure for the delicate parts inside without the dangers inherent in effecting such a closure by soldering or welding with consequent heating as is normally done when securely mounting such a housing on a base.

Referring now to the drawings.

Figures 1, 2, 3, 4, 5, 6:
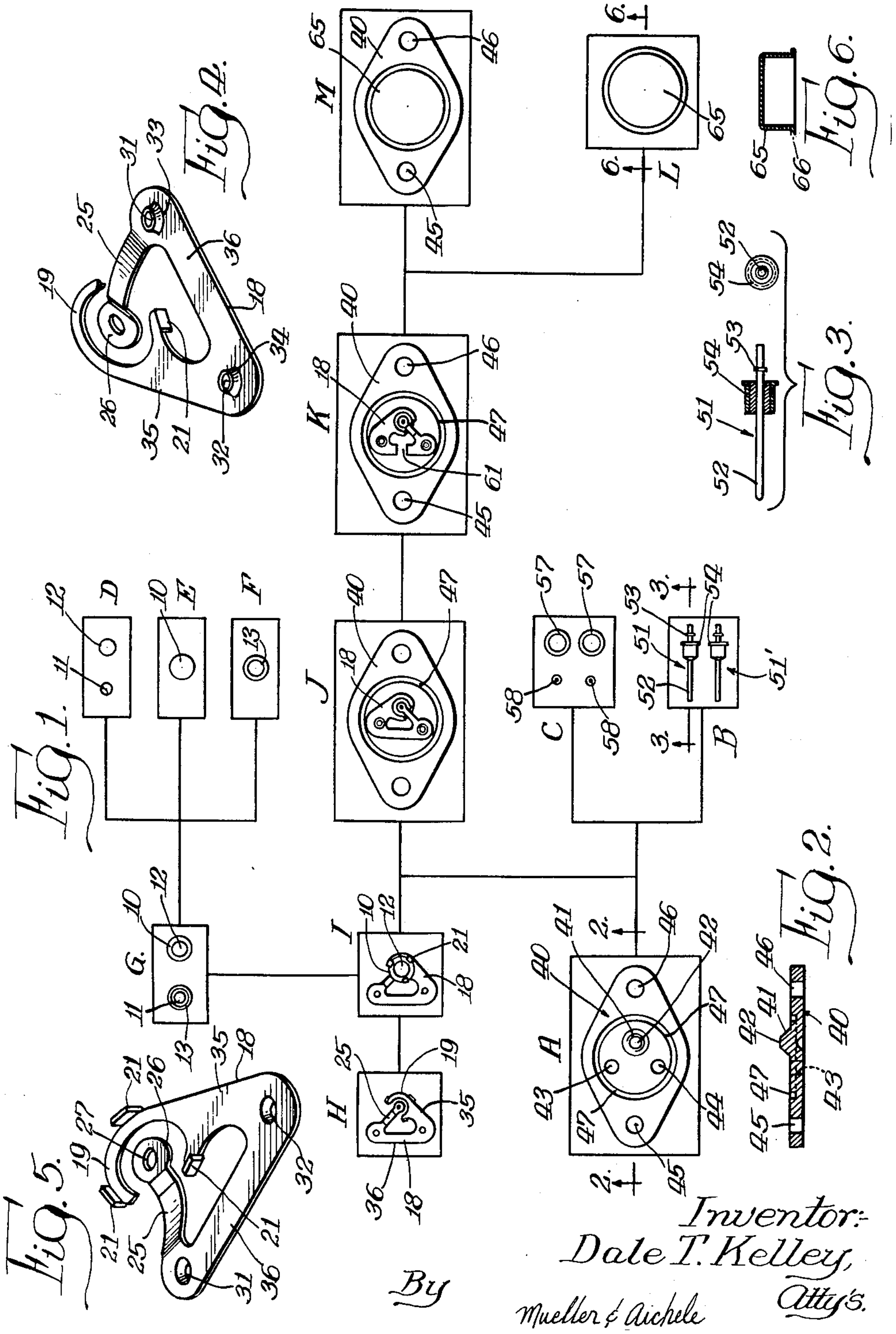
FIG. 1 is a diagrammatic illustration of the steps in manufacturing a power transistor as one embodiment of the present invention, it shows in actual size the elements which go to make up the subassemblies, and shows the subassemblies which go to make up the final encapsulated transistor with such subassemblies in the actual size of those in one embodiment of the invention.
FIG. 2 is a cross section taken along the line 2—2 as shown in box A of FIG. 1, of the one-piece mounting base and collector electrode for the power transistor.
FIG. 3 is a combination view showing an enlargement of the feed-thru subassembly of box B in FIG. 1 with a cross sectional illustration along the line 3—3 of the unit in the box, and a top plan view thereof projected to the right.
FIG. 4 is an enlarged perspective of the one-piece metal clip for holding the semiconductor unit as illustrated in box H of FIG. 1, and which serves as a self-jigging subassembly frame in the manufacturing operation or assembly at the step wherein the pieces are in the position illustrated in box J of FIG. 1.
FIG. 5 is an enlarged perspective of the clip shown in FIG. 4 but inverted from its position in FIG. 4.
FIG. 6 is a cross sectional view along the line 6—6 of the cap illustrated in box L.

In the illustrated embodiment of my invention I provide a p-n-p type of power transistor with a germanium die or wafer having indium emitter and collector buttons alloyed to opposite faces of the germanium, and with a tin-lead-antimony ring fused to the germanium die at the outer edge thereof to provide both mechanical support for the die and an electrical base connection to a clip. The clip in turn has the multiple function of an electrical conductor and a self-jigging frame to position the germanium wafer subassembly when mounting the same for fusing on to a pedestal electrode. Such pedestal is formed integral with a copper one-piece diamond-shaped element serving as a combination mounting base and collector electrode for the power transistor. The mounting base provides a highly efficient thermal path to take the heat which is generated in the operation of the transistor away from the semiconductor unit at its junction with the pedestal electrode to a heat radiator to which the mounting base is thermally and mechanically connected. The diamond-shaped combination base and electrode for the power transistor is stamped from relatively heavy copper and the integral pedestal is coined or swaged therefrom in the stamping step. Thereafter a circular groove is cut in the topside of the base, and this groove is adapted to loosely receive a cap or cover in the last assembly step of manufacture. The last step is a swaging or staking operation wherein metal is pressed over the rim of the cover to provide a tight vacuum sealed enclosure for the operating elements of the transistor. By accomplishing this sealing without heat or solder, the danger of heat injury or solder flux contamination to the internal elements of the transistor is avoided.

This power transistor embodiment of my invention is manufactured in a series of steps which minimize the danger of spoilage or wastage in manufacture and provides an efficient power transistor at low cost. This is accomplished by first providing several subassemblies, and then putting together by hand and by machine such subassemblies and additional elements into the complete device. The semi-conductor subassembly in the embodiment illustrated comprises a round germanium wafer and two round indium buttons of different size, the smaller button serving ultimately as the emitter, and the larger button as the collector for the semiconductor unit. A tin-lead-antimony ring having an outer circumference corresponding to the outer circumference of the germanium wafer provides the base connection for such unit. These elements are assembled in a carbon jig with the collector button on one side, and the emitter button and the base connection ring on the other side of the wafer. The indium buttons are alloyed to the opposite faces of the germanium wafer and the base connection is fused to one side thereof, to provide, when thus assembled, a semiconductor unit that is then placed on a prestamped metal clip having prongs which are bent over to secure the unit thereon. This latter complete subassembly is then mounted on a previously provided subassembly which comprises the copper mounting base and a pair of feed-thrus which had been previously assembled and which will ultimately serve as pronged electrodes for the emitter and the base connections of the semiconductor unit.

Each feed-thru consists of a brass pin with electrical insulating means thereon comprising a glass ring encircling and fitting tightly to the pin at a predetermined place thereon and a metal housing outside of the glass bead and electrically insulated from the pin. A flange is formed near one end of the pin and spaced a predetermined distance from the electric insulator assembly. Each feed-thru is assembled on the copper mounting base with a solder preform between the metal housing on the insulator and such base, and with a solder preform ring on the upper side of the integral flange on the pin. Then, the clip-semiconductor assembly is placed on the mounting-base-feed-thru assembly with the upper portion of each feed-thru prong extending through a corresponding aperture in the clip frame and the clip and semiconductor unit within the clip positioned on the top of the pedestal portion of the base. At that time, the solder preforms and the semiconductor units are capable of being melted sufficiently to accomplish soldering or fusion of the adjacent parts upon the application of heat to the assembly. This fusion is accomplished by putting the entire assembly into an inert or reducing atmosphere furnace where the clip is fused to the emitter and base connection pins, each feed-thru is soldered to the base plate, the semiconductor unit is fused to the assembly clip, and the collector electrode of the semiconductor unit is soldered to the pedestal portion of the base. All of this soldering is accomplished by only seven joints, and in an inert or neutral atmosphere of nitrogen or argon which avoids contamination to the internal parts of the unit. Originally, thin silver-gold layers are applied to the base, to the feed-thrus, and to the clip all before assembly, and as a result the soldering or fusion is completed without flux but providing a strong juncture of the parts.

After the soldering or fusion in the furnace, a one-piece metal cap is placed at its rim in the circular groove in the base, and a hydraulic press pushes the rim of the cap to the bottom of the groove and swages the adjacent metal of the base into the groove and into contact with the wall of the cap adjacent the rim so as to provide in a cold-sealing step an air-tight closure for the semiconductor unit. Accomplishing this final sealing step without the use of heat eliminates the danger of injury to the semiconductor unit within the housing and possible early failure of the transistor.

Figure 7:
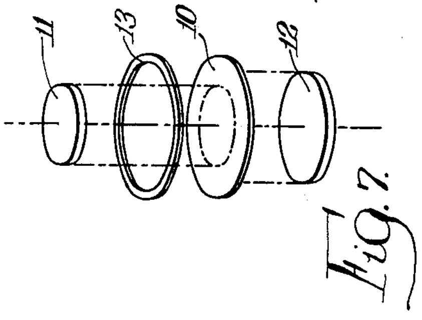
FIG. 7 is an exploded enlarged view of the elements in the semiconductor subassembly to be mounted within the clip of box H, and these elements here shown enlarged are the four illustrated in actual size in boxes D, E and F of FIG. 1.

More specifically, to construct the transistor described above, a disc-shaped wafer or die 10 (FIGS. 1, 7 and 8), composed, for example, of n-type low-resistivity germanium, is assembled with an emitter button or disc 11 designed to form an emitter junction or electrode, a disc or button 12 designed to form a collector electrode, and a ring 13 designed to form a base electrode or connection. If the die 10 is of n-type semiconductor material, the discs 11 and 12 are of p-type material such as indium, gallium or the like and the ring 13 is of n-type material such as a known tin-lead-antimony alloy to form an ohmic contact with the die and is assembled on the die in a position surrounding the emitter disc or electrode 11. The assemblage with the emitter and base electrodes on one face of the die and the collector electrode on the opposite face of the die are heated in a carbon jig (not shown for it is not specifically a part of the present invention) in an inert atmosphere by a known method to fuse the discs 11 and 12 and the ring 13 to the die 10 to form a transistor die assembly or subassembly. The discs or buttons 11 and 12 now become emitter and collector junctions or electrodes respectively of the die assembly, and the ring 13 is the base electrode. The faces of the die 10 are parallel with the Miller (111) crystallographic planes so that in the alloying operation planar recrystallized p-n junctions 14 and 15 (FIG. 8) are formed parallel with one another with a base region 16 therebetween. Also, during the alloying, outer faces of the discs 11 and 12 are confined in the jig to keep them flat and parallel with the faces of the die 10. The regrowth and junction areas in FIG. 8 would be considered as illustrative showings, for it would be impossible to cross hatch or stipple the areas indicated. The word references are used for explanatory purposes.

Figure 8:
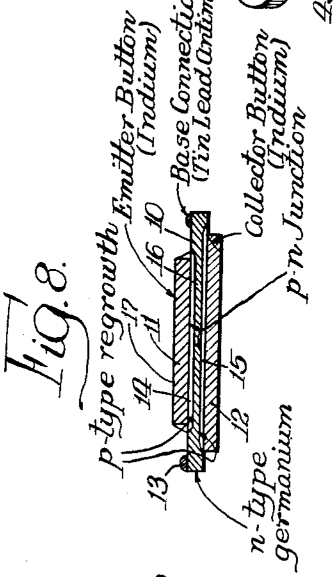
FIG. 8 is a cross sectional view of the assembled semiconductor unit illustrated by elements in smaller size in FIG. 7.

To recapitulate, the preassembled device which makes up into the die assembly, or as it is sometimes called, the semiconductor unit of the transitor of my invention is illustrated in the cross sectional enlargement of FIG. 8. This semiconductor unit is illustrated in actual size in box G of FIG. 1 with the side carrying the emitter button 11 and the base connection 13 illustrated at the left in that box and the side carrying the collector button being illustrated therein to the right. The individual pieces are illustrated in actual size in boxes D, E and F of FIG. 1 and in enlarged size in FIG. 7. Because the pieces are tiny and the relative sizes and the assembled positions thereof are somewhat difficult to readily visualize, dotted projection lines are used in FIG. 7 to show relative sizes and to show how the preformed base connection ring 13 encircles but avoids the emitter button 11 while serving as a frame for the very thin germanium die 10. The ring 13 being tin-lead-antimony, fuses readily to the corresponding face of the germanium The base connection thereby provides a very useful framing function and provides a nonrectifying connection to the germanium when the semiconductor unit or die assembly is complete with the collector button alloyed to the germanium wafer or die 10 as shown in FIG. 8. Then in the manufacturing operation, this subassembly is mounted on a one-piece frame and lead element as shown in box I and thereafter the method continues as will be explained.

The die assembly is then placed in a socket or cavity of a plate-like frame or clip 18. The clip is stamped out originally as a one-piece metal member illustrated in the enlargements of FIGS. 4 and 5, and in actual size in box H of FIG. 1. The socket is formed as a flat discontinuous ring portion 19 serving as the bottom of the socket, while the walls of the socket are formed by tabs 21 at points spaced around the periphery of the ring portion 19. The ring 19 engages the base electrode 13 and the tabs 21 are bent over one face of the die 10 as viewed in FIG. 1 box I, in contact only with the die 10 and not touching the collector electrode 12. A plate-like emitter lead or arm 25 of the clip 18 has a disc-shaped end portion 26 with a hole 27 therein, and the portion 26 engages the emitter electrode 11 in the assembly. The emitter lead 25 is arched or bowed so that the end portion 26 is pressed by spring pressure against the emitter button to provide a firm contact therebetween while the bow or arch at the same time prevents contact between the arm 25 and the base electrode 13.

The clip or holder 18 is formed from a strip of brass in a multiple stamping and cutting operation and has holes 31 and 32 formed therein surrounded by concentric flanges 33 and 34 drawn out of the plane of the clip 18. The ring 19 is on the end of the arm portion 35 to form a base lead. An arm portion 36 originally connects the emitter arm 25 and the base arm 35, and the clip 18 is maintained as a one-piece member through the assembly steps represented by the illustrations in boxes H, I and J of FIG. 1. After stamping, the clip 18 which may be brass of a mild spring temper, is plated with silver to form a protective layer over the brass base and to serve as a bonding or soldering material on the portions thereof to be subsequently joined to other elements. Gold is plated in a thin layer over the silver to prevent corrosion of the silver and eliminate any necessity of flux in the subsequent fusing or soldering operation by keeping the surface of the silver untarnished.

Between step J and the step illustrated at box K the elements are soldered or fused by heating in a furnace into a rigid construtcion. At this step in the process the clip is cut as shown in box K and the various electrodes are electrically separated.

As is clear from the introduction to this specification, an important factor in the commercial acceptance of a power transistor is high heat dissipation at the collector electrode. This is that electrode in the complete device which is in physical and electrical connection with the collector button 12 (FIG. 8). On a standard rating basis, an embodiment of the power transistor herein described is rated at 10 watts with the base corresponding to the present base 40 (box A, FIG. 1) maintained at 80° C. This represents power dissipated in the transistor at the collector electrode 12, and means a high dissipation factor, wherein there is at least 1 watt dissipated per degree temperature differential between the collector 12 and the mounting base 40.

Figure 11:
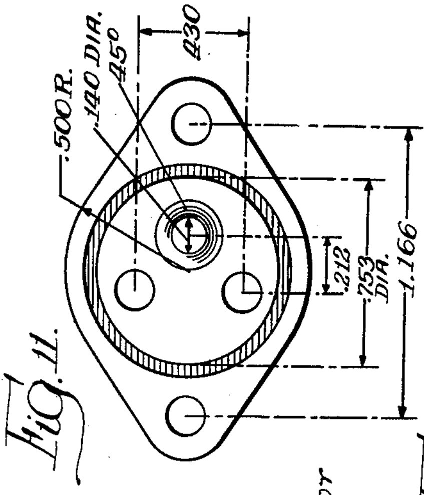
FIG. 11 is an enlarged plan view of the mounting base of FIG. 2 with various actual dimensions from one embodiment of my invention noted thereon.

Referring more specifically to the mounting base 40, it consists of a diamond-shaped one-piece member in a metal such as copper with high thermal and electrical conductivity characteristics. It is produced by a multiple stamping and coining action which cuts the base 40 from an elongated strip or bar of copper, and in this process a frustoconical pedestal 41 is coined or drawn in the member with a flat top 42 (FIGS. 1, 2 and 11). In addition, holes 43 and 44 for connector subassemblies, and mounting holes 45 and 46 for subsequently mounting the transistor are formed in the heavy copper member. The diamond-shaped mounting base 40, after being so produced from the bar or stock, is then placed in a suitable lathe or the like and a groove 47 is cut therein. Then a heavy silver layer is plated on all the surfaces of the mounting base 40, and a film of gold is plated over the silver layer to protect the silver layer against atmospheric or other corrosion so as to keep the outer surface of the silver layer unoxidized for a soldering operation during assembly.

Connectors 51 and 51′ (FIGS. 1, 3 and 9), or "feed-thrus" as they are called in the art, are provided as subassemblies. Each comprises a pin 52 with a flange 53 thereon near the upper end thereof. Metal cups or sleeves 54 with glass insulators 56 therein and sealed thereto are each mounted on a pin 51 and the insulator 56 is sealed to the pin.

Figure 9:
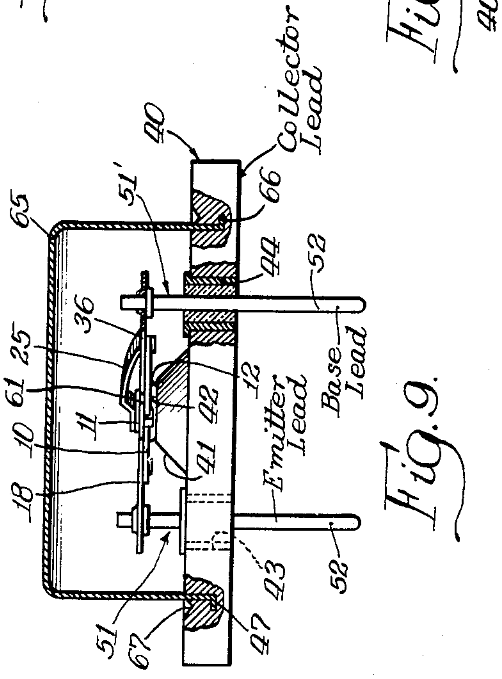
FIG. 9 is an enlarged illustration partly in cross section and partly broken away of the assembled power transistor shown in a top plan view in box M of FIG. 1.

In the method of manufacture the feed-thrus 51 and 51′ are assembled in the base 40 in the position shown shown best in FIG. 9, but of course, without the semiconductor unit and the housing there shown. So that the feed-thrus may be readily assembled they are dimensioned to fit rather loosely in the holes 43 and 44 of the base. However, in order to have a permanent and fully sealed connection between the base and these units preparations are made for soldering this connection in a subsequent process step. Accordingly, before a feed-thru is assembled on the mounting base 40, a solder preform 57 (box C, FIG. 1) is placed on the top of the base at each hole 43 and 44. A solder preform 58 of a size to fit over the top of a pin 52 is placed upon a sponge rubber pad, the pin is inserted into the hole of the preform and when the feed-thru is upended the preform 58 rests down against the integral flange 53 near the top of that pin. With the preforms 57 in position the feed-thrus 51 and 51′ are mounted in the base over the outside of each cup 54 to lay between the top of the base 40 and the inside of the flange at the top of such cup and this subassembly is ready for the semiconductor unit of box I (FIG. 1) to be placed in the position shown in box J.

Then the clip-die assembly including the clip 18 and the die subassembly held thereby is placed over the feed-thrus 51 and 51′ with the holes 31 and 32 in the clip 18 fitting respectively over the top of each pin 52 so that the flanges 33 and 34 rest against the preforms 58. In the enlarged showing of FIG. 9, the preforms 58, and also the preforms 57 have melted and fused into a soldered joint, as will be described, and representing only a small amount of solder do not readily show. However, in view of this explanation and the illustrations in box C, FIG. 1, details of a melted condition are not believed to be necessary for a full understanding. The clip-die assembly is supported by the flanges 53 of the feed-thrus 51 and 51′ and the pedestal 41 with the collector electrode 12 resting on the flat top 42 thereof.

At this stage, as above described, the die subassembly and the clip 18 as well as the feed-thrus 51 and 51′ are in precisely located positions on the mounting base 40 ready for assembly with one another and with that base in what is a self-jigging assembly.

The emitter lead arm 25 presses its disc-like end 26 thereof against the emitter electrode 11, the ring portion 19 and the tabs 21 thereon hold the base ring 13 therein, and the weight of the assembly holds the collector electrode 12 against the top 42 of the pedestal 41 in face-to-face contact therewith. This preassembled position is maintained more positively by a retaining action of the flanges 33 and 34 whose configuration also facilitates positioning the clip subassembly on the tops of the pins 52. Inasmuch as a firm and preferably a full face contact is desired at this step in the process between the collector button and the top 42 of the pedestal in the base, it would be a complex assembly operation if the small parts heretofore described were not of such construction that every move thereof is facilitated and positioning is certain. However, in practicing the present method on a mass production basis at high speed a full face contact in a parallel plane with the top 42 is not always possible. But the height and configuration of the pedestal 41 accommodates a slight tipping or slightly non-parallel position of the collector electrode and still makes it possible to have a fully soldered connection in the heat step which will be next described.

The assembly of box J is then placed in a furnace (not shown), and inert or reducing gas is introduced into the furnace. The furnace is heated to a temperature at which the solder rings 57 melt to wet the cup 54, the base 40, and the flanges of the cups, while at the same time the silver and gold on the portion of the emitter lead arm 25 engaging the emitter electrode 11 and the upper face 42 of the pedestal 41 melt to wet the indium electrodes 11 and 12 thoroughly. The electrodes 11 and 12 also soften somewhat so that the portion 27 of the emitter lead 25 and the pedestal 41 embed themselves somewhat into the electrodes, and the base ring 13 is soldered to the ring 19 of the clip 18. Also, the preforms 57 melt to form the solder connections at the flanges of the pins 52 to secure the clip thereon. Actually seven soldered joints or connections are made in this heating step.

Figure 10:
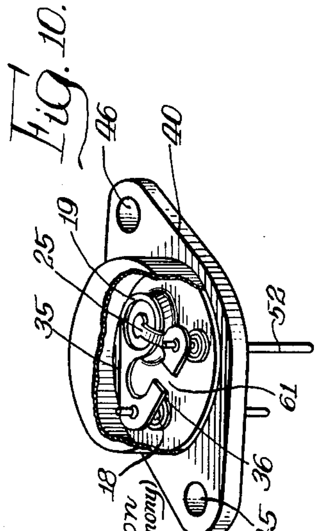
FIG. 10 is a perspective view of the assembled transistor of FIG. 9 with only a portion of the cap broken away.

The assembly is then cooled to solidify the melted and softened portions and, in all, fuse the emitter lead end portion 26 to the emitter electrode 11, fuse the pedestal 41 to the collector electrode 12, fuse the open ring 19 of the base lead 35 to the base electrode 13, solder the clip 18 to the flange 53 of each of the connectors 51 and 51′, and solder the connectors 51 and 51′ at the flanges on the cups 54 to the mounting base 40 in air tight, completely sealed relationship relative thereto. Then a section shown at the void 61 (FIG. 10, and box K of FIG. 1) in the arm 36 is cut out by a tool to separate the emitter lead 25 from the base lead 35. Thereafter the assemblage of elements is subjected to a known electrolytic cleanup or washing treatment.

Thereafter, a cover 65 (FIG. 1, box L, and FIG. 9) having an outwardly turned bottom flange or rim 66 is placed in a position over the holder 18 in the die assembly with the rim of the cover resting on the bottom of the groove 47 in the base 40 and the inner wall of the cover abutting the inner wall of the groove 47. A hydraulic press (not shown) with a force applied of five to seven tons then presses a staking ring against the base 40 to form an annular ring 67 in the metal surrounding the outer wall of the groove 47 and swage it tightly over the flange 66 and against the cover 65. In the swaging operation the punch or staking ring effecting the displacement of metal against the cover 65 is lightly lubricated with a top quality lubricant such as silicone oil. With this step the metal of the base 40 and the rim and lower portion of the cover are squeezed together so as to form a hermetic seal therebetween due, of course, to the mechanical force exerted by the swaging. The cover is fused to the mounting base at the top, bottom and end of the rim 66 and at the inner and outer walls of the portion of the cover just above the rim. The swaging is effected without applying heat to the elements 40 and 65 so that no spattering, inherent in electrical welding and hot soldering operations, or contamination resulting from such spattering occurs. The cover 65 also is held very strongly mechanically to the base 40 with the rim 66 acting as a firm anchor embedded in the base 40.

The above-described transistor is very rugged and has only a very thin layer of indium positioned between the p-n collector junction formed between the collector electrode 12 and the die 10. The electrode 12 is initially about .010″ thick, but after being fused to the pedestal 41 is less than .008″, and while indium is not one of the better heat conducting metals, the layer between the copper pedestal 41 and the p-n collector junction is thus so thin that no appreciable thermal barrier is present between the excellent heat conductive base 40 and the collector p-n junction. Thus, heat is transmitted very effectively away from the collector p-n junction to the pedestal 41 and the base 40. The final dimension occurs because during the planar alloying thereof with the n-type germanium die 10 to form a p-n junction 15 therebetween, the disc spreads somewhat and the thickness is somewhat reduced. Also during the soldering operation in which the collector electrode 12 is pressed against the pedestal 41 by the weight of the clip 18 and the die assembly therein, as well as by the gripping action at the tops of the feed-thrus 51 and 51′, the pedestal is slightly embedded in the collector electrode 12 when the latter is softened during the soldering operation. The final dimension of the indium layer is so thin that a negligible thermal barrier is present between the collector junction and the pedestal 41.

The pedestal forms the start of the heat path which also includes the mounting base 40 and a radiator 81 (FIGS. 13 and 14). The base 40, the pedestal 41 and the radiator 81 form an effective heat path, and heat dissipation between the collector junction and the base is such that less than 1° C. temperature rise occurs between the collector junction and base per watt of power dissipated in the transistor.

Figure 12:
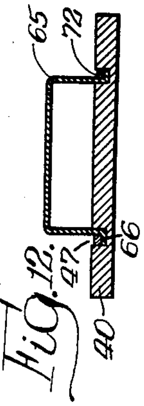
FIG. 12 is a cross sectional view of an assembled cap and base shown alone for illustrative purposes as secured together by another cold-sealing method to that of FIG. 9.

The cover 65 also may be secured to the base 40 by placing (FIG. 12) a soft solder or soft metal ring 72 in the groove 47 in the base 40 on top of the flange 66 of the cover 65. The cover 65, in this instance, is first placed in the groove 47 as in the principal embodiment. The press swages the outer rim of the metal of the base 40 at the groove 47 over the soft metal ring 72 to fuse the base metal and ring 72 to the cup rim and to lower sidewall of the cover 65. Except for the inclusion of the ring 72, it appears exactly as shown in FIG. 9. In both closures (FIGS. 9 and 12) there is a uniform bond over 360°, and as previously described, this cold-sealing provides a tight hermetic seal.

The structure and method of manufacture as above described embody my invention so that a transistor may be fabricated very rapidly, requires no jigging during the soldering operation thereon, and effects all soldering operations in a single easy step. Since the parts to be joined have silver protected by gold thereon, no flux is required during the soldering operation and spattering and contamination of the die assembly and contacts are thereby prevented.

While the die assembly or semiconductor unit described has been indicated to be a p-n-p type, it obviously could be an n-p-n transistor. Also, while illustrated as an alloy junction type transistor with heavy emitter and collector electrodes, other types of semiconductor units as diffused base transistor die assemblies, for example, with electroplated or vapor plated electrodes could be used in place of the alloy junction die assembly described herein. Also, the invention is not limited to a three electrode semiconductor device, and the excellent heat dissipation from the pedestal-in-the-base construction for direct application of a semiconductor die assembly could be utilized in devices with a different number of electrodes.

Power transistors constructed in accordance with the present invention have the selected dimensions as hereinafter listed solely for purposes of illustration and are not intended to limit the scope of the invention in any way.

| | |
|---|---|
| **Dimensions of Constructed Unit:** | |
| Mounting base **40**: | |
| Length | 1.56″. |
| Width | 1.12. |
| Thickness | 0.125±.010. |
| Pedestal **41**: | |
| Height | 0.062″. |
| Diameter at top | 0.140″. |
| Sides | at 45° angle. |
| Cover **65** when sealed to base: | |
| Outside diameter | 0.800″. |
| Outside height above top surface of base | 0.41″. |
| Cover **65** before mounting: | |
| Outside height | 5/16″. |
| Outside diameter of rim | 0.848″±.002. |
| Die **10** before assembly: | |
| Diameter | 0.260±.002. |
| Thickness | 0.0080±.0002. |
| **Maximum Ratings:** | |
| Collector D.C. voltage | −16 v. |
| Instantaneous peak collector voltage referred to emitter | −30 v. |
| Collector D.C. current | −3 A. |
| Collector dissipation at mounting base temperature 80° C | 10 w. |
| Storage temperature | 90° C. |

I claim:

1. A method of fabricating a semiconductor device which includes, placing in assembly position a metal base support structure having a plurality of pins protruding above the surface of said structure, placing semiconductor-die-means and apertured metal-connector-means on the base support structure with the pins in metal-connector-means apertures to thereby properly position the metal-connector-means on the support structure, and maintaining such position by the pin and connector-means aperture arrangement for the subsequent soldering step in the fabrication of the device, providing soldering material without soldering flux at the pins, soldering the assembly of base support structure, metal-connector-means, and semiconductor-die-means at a predetermined temperature to melt material in such assembly which has a melting point below such predetermined temperature, and cooling the fabricated assembly to solidify the material melted in the soldering step and secure said entire device together.

2. A method of fabricating a semiconductor device substantially without the use of independent jigs and assembly fixtures except for structure which is ultimately a part of the device itself, said method including placing in assembly position a metal base support structure, assembling in bores in said metal base support a plurality of pins so that the pins protrude above the surface of said base support structure, assembling solder preforms with said pins, placing semiconductor-die-means on the base support structure and apertured metal-connector-means on the base support structure with portions of said latter means positioned at the semiconductor-die-means, and with pins in apertures of the metal-connector-means to thereby properly position the metal-connector-means on the base support structure all without the use of independent jigs and assembly fixtures, maintaining such position by the pin and connector-means aperture arrangement for the soldering step in the fabrication of the device, soldering the assembly of base support structure, connector-means, and semiconductor-die-means at a predetermined temperature to melt material in such assembly which has a melting point below such temperature and accomplishing such soldering without the use of soldering flux at the solder preforms, and cooling the fabricated assembly to solidify the material melted in the soldering step and to secure together into a rigid assembly said entire device.

3. A method of fabricating a semiconductor device substantially without the use of independent jigs and assembly fixtures except for the use of structure which is ultimately a part of the device itself, said method including placing in position a base structure for assembly of parts therewith, placing a plurality of pins in bores in the base structure, assembling preformed solder pieces with said pins and without soldering flux, placing semi-conductor-means and also apertured connector-means on the base structure to so locate the connector-means relative to said pins, predeterminedly positioning the connector-means of the base structure by means of said pins, maintaining such position by the pin and aperture arrangement for a subsequent soldering step, soldering at a predetermined temperature the assembly of the base structure, pins, semi-conductor-means, and connector-means to melt material in such assembly which has a melting point below the temperature to which such assembly is exposed, and thereafter cooling such assembly to secure the same together.

4. A method of fabricating a semiconductor device including, placing in assembly position a metal base support structure having a plurality of pins protruding above the surface of said structure, preassembling semiconductor-die-means and apertured metal-connector-means with the die-means in engagement with one portion of the connector-means for subsequent mounting as a preassembly on the base support structure, placing the preassembly on the base support structure with apertured portions of the connector-means on corresponding pins to thereby position the metal-connector-means on the support structure, maintaining such position by the pin and connector-means-apertured portion arrangement for a subsequent soldering step in the complete fabrication of the device, providing soldering material at the apertured portions and corresponding pins without soldering flux, soldering the base support structure and that structure assembled thereon at a predetermined temperature to melt material in such complete assembly which has a melting point below such predetermined temperature, and cooling the fabricated assembly to secure the same together.

References Cited in the file of this patent

UNITED STATES PATENTS

| | | |
|---|---|---|
| 787,578 | Lambert | Apr. 18, 1905 |
| 1,571,907 | McClanahan | Feb. 2, 1926 |
| 2,472,131 | Toth et al. | June 7, 1949 |
| 2,680,824 | Beggs | June 8, 1954 |
| 2,725,505 | Webster et al. | Nov. 29, 1955 |
| 2,744,308 | Toman | May 8, 1956 |
| 2,762,001 | Kilby | Sept. 4, 1956 |
| 2,762,956 | Ingraham | Sept. 11, 1956 |
| 2,791,480 | Larson | May 7, 1957 |
| 2,792,271 | Beggs | May 14, 1957 |
| 2,792,272 | Beggs | May 14, 1957 |
| 2,796,563 | Ebers et al. | June 18, 1957 |
| 2,822,498 | Koskes et al. | Feb. 4, 1958 |
| 2,838,722 | Watson | June 10, 1958 |
| 2,846,625 | Gustapon et al. | Aug. 5, 1958 |
| 2,847,623 | Thornhill | Aug. 12, 1958 |
| 2,882,462 | Zierdt | Apr. 14, 1959 |
| 2,896,136 | Haleo | July 21, 1959 |
| 2,913,642 | Jenny | Nov. 17, 1959 |
| 2,919,387 | Cornelison | Dec. 29, 1959 |
| 2,928,030 | Tighty | Mar. 8, 1960 |
| 2,929,972 | Roka et al. | Mar. 22, 1960 |
| 2,962,639 | Pensak | Nov. 29, 1960 |